United States Patent
Shacham et al.

(10) Patent No.: US 7,519,931 B1
(45) Date of Patent: *Apr. 14, 2009

(54) APPLYING CNF SIMPLIFICATION TECHNIQUES FOR SAT-BASED ABSTRACTION REFINEMENT

(75) Inventors: Ohad Shacham, Monash (IL); Omer Bar-Ilan, Haifa (IL); Oded Fuhrmann, Yaakov (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/250,534

(22) Filed: Oct. 13, 2008

Related U.S. Application Data

(63) Continuation of application No. 12/060,260, filed on Mar. 31, 2008, now Pat. No. 7,441,216.

(51) Int. Cl.
*G06F 17/50* (2006.01)
(52) U.S. Cl. .................. 716/5; 716/2; 716/3; 716/4
(58) Field of Classification Search ............ 716/1–5, 716/18; 703/2, 14–15
See application file for complete search history.

(56) References Cited

U.S. PATENT DOCUMENTS

| | | | |
|---|---|---|---|
| 7,302,656 B2 | 11/2007 | Weber et al. | |
| 2002/0095645 A1 | 7/2002 | Rodeh | |
| 2003/0110455 A1 | 6/2003 | Baumgartner et al. | |
| 2004/0153308 A1 | 8/2004 | McMillan et al. | |
| 2004/0230407 A1* | 11/2004 | Gupta et al. | 703/2 |
| 2005/0166167 A1* | 7/2005 | Ivancic et al. | 716/5 |
| 2006/0129959 A1 | 6/2006 | Mang et al. | |
| 2006/0212837 A1* | 9/2006 | Prasad | 716/5 |
| 2007/0174799 A1 | 7/2007 | Baumgartner et al. | |
| 2007/0226666 A1* | 9/2007 | Ganai et al. | 716/5 |

* cited by examiner

*Primary Examiner*—Paul Dinh
(74) *Attorney, Agent, or Firm*—MaxValueIP, LLC

(57) ABSTRACT

The present embodiment keeps track of a set of resolution required for generating each one of the clauses added by the simplification Method. This information is used by the method that generates the unsat core in order to extract the original clauses that generated the simplified clauses. This work integrates resolution based CNF simplification technique inside the SAT-based abstraction refinement scheme in a unique way that overcomes the difficulties.

1 Claim, 2 Drawing Sheets

APPLYING CNF SIMPLIFICATION TECHNIQUES FOR SAT-BASED ABSTRACTION REFINEMENT

RELATED PRIOR APPLICATION

This application is a continuation of an allowed/patented application with the same inventors and assignee, Ser. No. 12/060,260, filed 31 Mar. 2008, now U.S. Pat. No. 7,441,216 with the same title.

BACKGROUND OF THE INVENTION

Nowadays, the model checking techniques are based on SAT (satisfiability) solvers. SAT solvers are less size sensitive than the formerly used BDDs (Binary Decision Diagrams) and capable to handle much larger designs. Therefore, much work in the area of model checking exploit the power of SAT solvers and integrate these techniques inside their algorithms.

SAT solver's task is to either find a satisfying assignment for a CNF (Conjunctive Normal Form) formula or to prove that one does not exist. This task is NP-complete. Therefore, a SAT solver is based on optimization and heuristics. In order to accelerate and enhance the power of a SAT solver, there are many works in the field of CNF simplification. These techniques perform semantic and syntactic reductions on the CNF formula in order ease the SAT solver's work in finding a satisfying assignment or to prove that one does not exist. Empirically, these simplification techniques significantly accelerate the run of the SAT solver, therefore, they are being used in many SAT-based techniques.

Another technique to cope the size problem in model checking is the use of abstractions. Abstraction techniques generate an abstract model that represents a super set of the states that are represented by the corresponding concrete model. Therefore, if one proved that a specification holds in an abstract model then the specification also holds in its corresponding concrete model. A representation of an abstract model is usually smaller than a representation of its corresponding concrete model therefore; it is easier to prove that a specification holds in an abstract model. However, due to the abstract states represented by the abstract model, the model checker may produce spurious counterexamples prove that the specification does not hold in the abstract model. For this reason, one can perform a refinement operation in order to discard some of the abstract states represented by the abstract model, this operation is called refinement and the general technique is called abstraction refinement.

SAT-based abstraction refinement model checking techniques are popular. These techniques combine two powerful methods that enable to verify specification on large and complicated designs. Therefore, the usage of SAT-based abstraction refinement techniques is common in the industry.

One of the options to accelerate SAT-based abstraction refinement techniques is by using a CNF simplifier as done in most other SAT-based techniques. However, integrating a CNF simplifier into the SAT-based abstraction refinement scheme is not straight forward due to the following reasons:

1. The simplification adds connections between variables that hurt the soundness of the refinement procedure.
2. Many refinement schemes work by building the formula gradually, and applying simplifications hurt the structural of the formula and destroy the ability to add the formula in a gradual and smart way.

SUMMARY OF THE INVENTION

This embodiment integrates resolution based CNF simplification technique inside the SAT-based abstraction refinement scheme in a unique way that overcomes the difficulties. The present embodiment keeps track of a set of resolution required for generating each one of the clauses added by the simplification method. This information is used by the method that generates the unsat core in order to extract the original clauses that generated the simplified clauses. One of the features of this integration is the performance speedup achieved by using the CNF simplifier.

DETAILED DESCRIPTION OF THE PREFERRED EMBODIMENTS

In order to provide the technical description of the ideas, few definitions are provided. SAT solver's input formula is given in a Conjunctive Normal Form (CNF), which is a conjunction of clauses, where each clause is a disjunction of literals and a literal is a variable or its negation.

A resolution between two clauses A and B may occur when there is exactly one shared literal between these clauses that appears in the negated polarity. The result of the resolution operation is a clause, known as resolvant, that contains all the literals in A and B but the ones corresponding to the shared variable. We refer to the shared variable as a pivot.

For example, given clauses $A=(x \vee y)$ and $B=(\underline{x} \vee z \vee k)$ then the resolution of A (200) and B (210) generates a resolvant clause $C$ (230)$=(y \vee z \vee k)$. The pivot of this resolution operation is the variable "x" (220).

Simplification techniques, such as Hypre, perform emulation of resolution steps in order to find variable relations inside the formula and to discard redundant information.

If a formula F proved by the SAT solver to be unsatisfiable. There is an option to generate an unsat core for F. An unsat core of an unsatisfiable formula F is an unsatisfiable subset of clauses of F. This core can be easily generated after the SAT solvers run using information gathered by the SAT solver.

Figure 1:
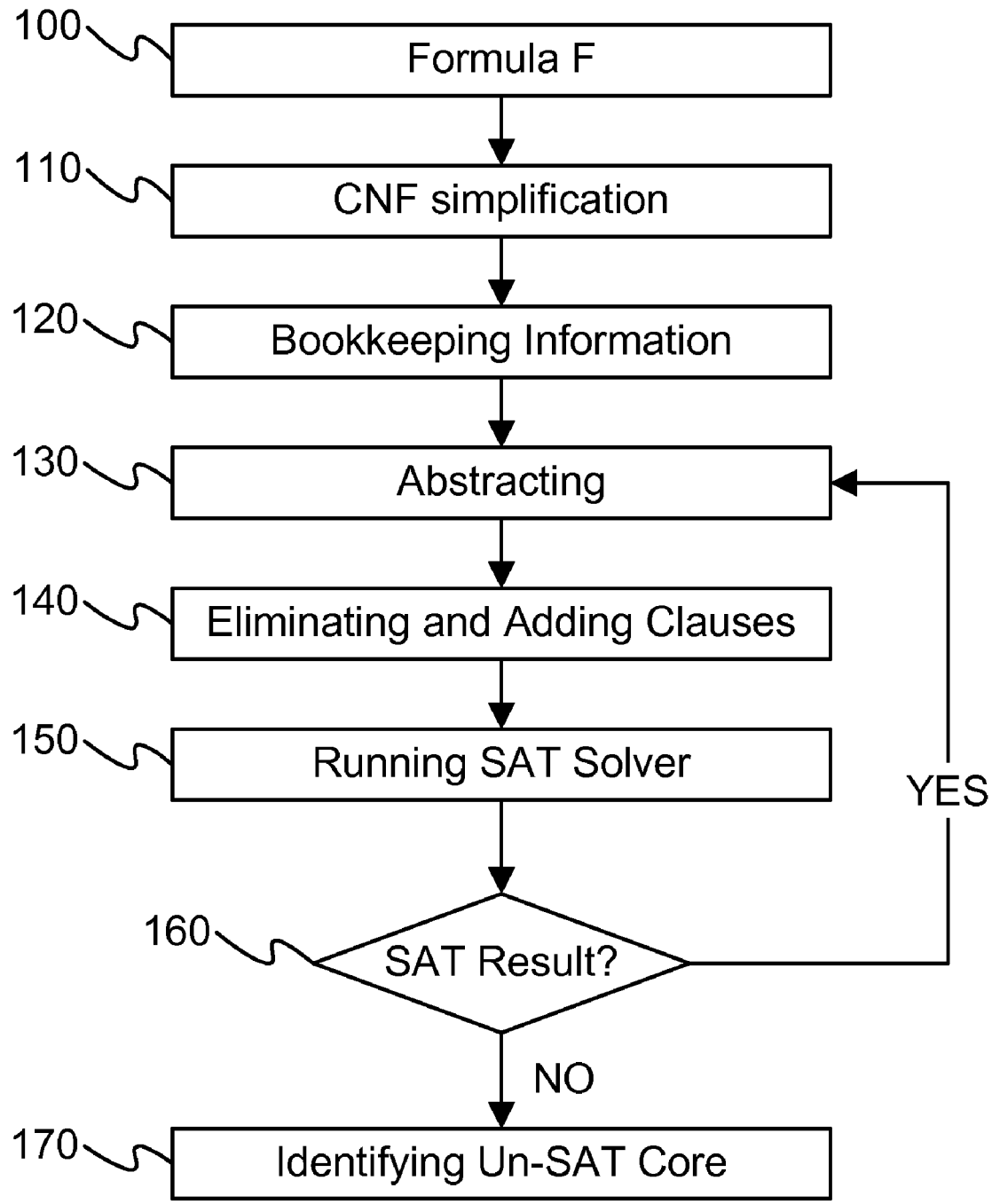
FIG. 1 is a flow chart of the CNF simplifier
Figure 2:
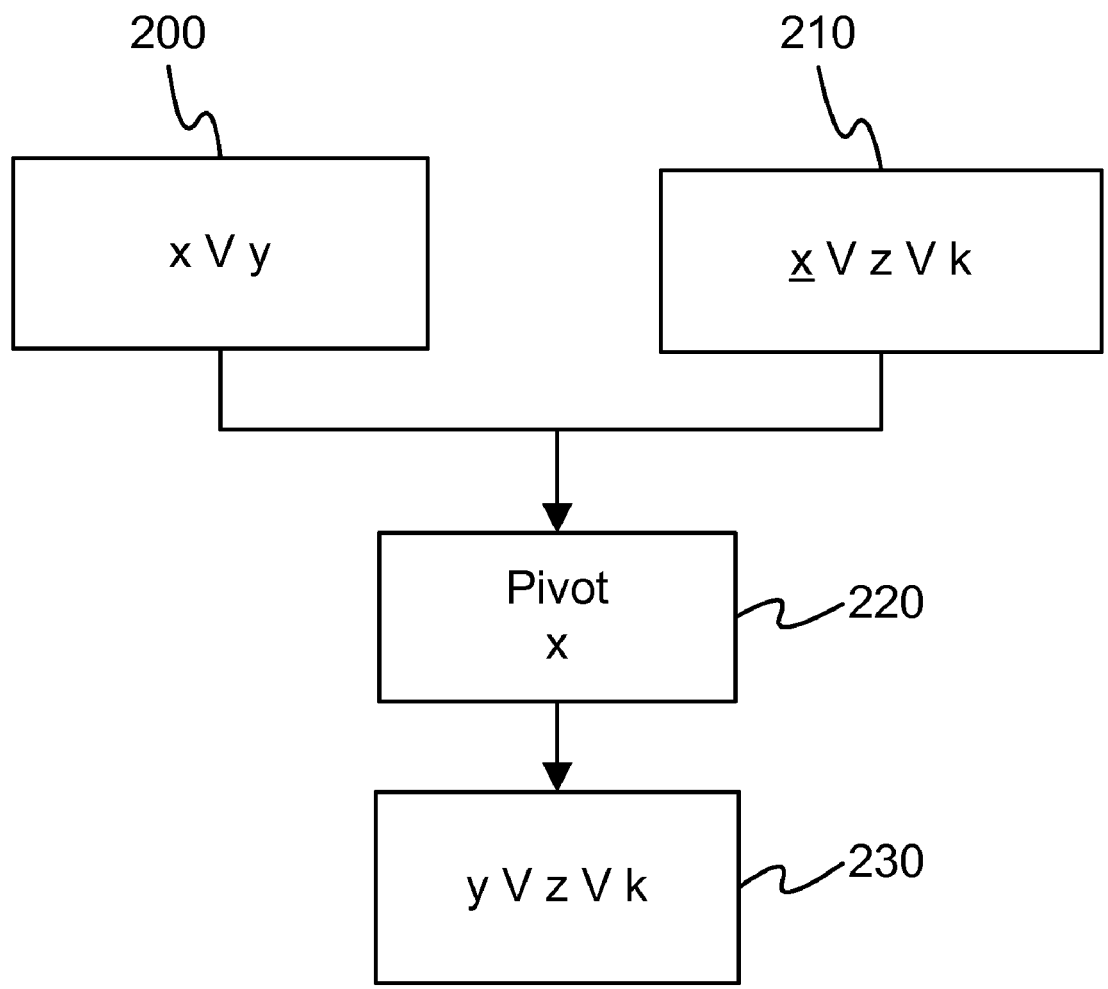
FIG. 2 is a schematic diagram of two clauses combination using a pivot

The unsat core feature is powerful and strong because it extracts from the formula the parts that cause its unsatisfiability, and therefore, it is being used by many techniques in many domains as well as abstraction refinement techniques depicted by FIG. 1.

In order to perform refinement operations the abstraction refinement scheme has a simulator that checks whether a given counterexample is spurious or whether it can be extended on the concrete model to a real counterexample. This simulation stage also generates an abstraction for the next iteration. Some simulators use an unsat core for the refinement operation. The idea is to use the information from the unsat core in order to decide which signals should take part in the abstraction of next iteration. Unfortunately, when using resolution based simplification and unsat core for generating abstractions the generated abstractions are too loose and contain fewer restrictions than needed.

The problem is demonstrated using the following example:

Let F be the original formula generated by an abstraction refinement engine and assume that the following clauses are part of F: A=($\underline{x}$ V y) and B=($\underline{y}$ V z)

Then, performing resolution based simplification on F generates a new clause C=($\underline{x}$ V z) by resolution of A and B.

Assume that clause C is part of an unsat core and that clauses A and B do not take part in the same core. Then, the generated abstraction contains signals x and z but not signal y. This generates a looser abstraction than the desired one due to the fact that the connection between signals x and z occurs because of signals y. Therefore, discarding y's behavior from the abstraction also discards the connection between x and z and therefore, the generated abstraction contain more behavior than the desired one.

The present embodiment overcomes this problem by book keeping the set of resolution required for generating each one of the clauses added by the simplification method. This information is used by the method that generates the unsat core in order to extract the original clauses that generated the simplified clauses. Using this information, the unsat core contains only original clauses occurred in the original formula before the simplification procedure. This guarantees that the generated abstraction contains all the required information.

For example, let's assume that while generating clause C from the previous example, the simplification procedure saved the information that clause C generated by the resolution of clauses A and B. Then, while generating the unsat core, the procedure for generating the core excludes clauses C from the core and adds clauses A and B instead. This procedure continues recursively until all the clauses in the unsat core exists in the original formula F. Making abstraction from the current core will include y's behavior due to the fact that clauses ($\underline{x}$ V y) and ($\underline{y}$ V z) are part of the unsat core. Therefore, the generated abstraction will be the desired one.

The "Layered Refinement" algorithm for efficient simulation adds partitions of signals incrementally to the formula until either getting an unsat answer (the counterexample is spurious) or find a descent counterexample. This algorithm called "Layered Refinement" due to the fact that the partitions are inserted to the model in layers. The layered refinement algorithm is very powerful because it both accelerates the runtime of the simulator and brings smaller abstractions.

The problem in applying resolution based simplification to the formula is the fact that the formula is build incrementally. There are a few other solutions to this problem; however, none of these solutions provide a good simplification that causes speedup. The other options are:

1. Run simplification on each partition separately—the problem is that this technique provides negligible speedup.
2. Run simplification after each layer insertion—very time consuming due to the fact that resolution based simplification should run on an unfolded model and many times as well.
3. Run resolution based simplification on a conjunction of partitions and separate to an estimation of partitions—not accurate and does not follow the notion of layered refinement.

The present embodiment uses the resolve trace information that was kept for each generated clause in order to solve the previous problem. In addition, for each removed clause, a list of removed resolve sources are added that can cause to a deletion of a clause from the formula. The removal of the clause is valid in certain terms due to the resolution based simplification.

The algorithm works as follows:

After every layer insertion the algorithm traverses all the resolve sources of the clauses generated by resolution based simplification and adds each clause so that all its corresponding resolve sources are in the formula. In addition, the algorithm removes each clause so that its deletion resolve sources are in the formula as well. The algorithm continues iteratively until a fix-point is reached. This way, we run resolution based simplification once on the conjunction of the partitions and use the generated information, together with the different resolve sources, to add and remove clauses from the formula in each stage during the layered refinement operations.

Note that it is possible to record the reasons for all additions/deletions of clauses during CNF simplifier run, thus forming the resolve trace. The resolve trace of CNF simplifier may further be used to extend the algorithm of building proof of unsatisfiability—to reconstruct also clauses resulting from CNF simplifier.

It was not possible to use CNF simplifiers efficiently in the abstraction refinement framework, including in layered refinement.

An embodiment of the invention is a method for applying conjunctive normal form simplification techniques to satisfiability-based abstraction refinement, the method is comprised of the following steps: (in a computer system) First, we receive a first Boolean formula (at first memory location) (100). Then, we generate second Boolean formula by applying conjunctive normal form simplification technique to the first Boolean formula. (110) Then, we generate book-keeping information during the simplification stage (120). Next, we generate a new formula, by abstracting the second Boolean formula, (130) eliminate or add clauses, based on the book-keeping information (140), and run the SAT solver (150).

If the SAT solver returns a satisfiable result (160) (then we have a counter-example, and we want to go from our abstract model to make a concrete model), then we want to do the refinement (by adding more layers). For each layer added (above), repeat the above steps again: generating a new formula, by abstracting the previous Boolean formula, eliminating or adding clauses, based on the book-keeping information, and running the SAT solver. We continue repeating the above loop, until we have unsat result, or we have sat result on the concrete model.

On the other hand, if after running the SAT solver, we get unsat result (170) (at anytime), then we identify unsatisfiable core in the last Boolean formula. Then, we can take the unsat core. We can also generate another unsat core using book-keeping information, wherein the clauses are only from the first Boolean formula (rather than after the simplification step, above).

We can also use the result above for the other abstraction. Or, we can use the unsat core for the next abstraction, for proof-based abstraction scheme.

In summary, we start from an original formula, and we go through simplification and abstraction, but still get the unsat core of the original formula using the backward mapping scheme produced by the simplification mechanism.

A system, apparatus, or device comprising one of the following items is an example of the invention: Boolean logic, formulas, counter-example, layer, memory, verification, testing, model, abstraction, model analyzing module, model design module, and computer system, applying the method mentioned above, for purpose of simplification, refining, and modeling.

Any variations of the above teaching are also intended to be covered by this patent application.

The invention claimed is:

1. A system for applying conjunctive normal form simplification techniques to satisfiability-based abstraction refinement, to extract original clauses that generated simplified clauses, in a computer module, said system comprising:
   a first memory location;
   a satisfiability solver;
   wherein a first Boolean formula is received, from said first memory location;
   a second Boolean formula is generated by applying conjunctive normal form simplification technique to said first Boolean formula;
   book-keeping information is generated during application of said simplification technique;
   a new formula is generated, by abstracting said second Boolean formula;
   clauses are eliminated or added, based on said book-keeping information;
   said satisfiability solver is run, in said computer module;
   wherein if said satisfiability solver returns a satisfiable result, then there is a counter-example;
   if said satisfiability solver returns a satisfiable result, refinement is done by adding more layers;
   each added layer among said layers is for refinement, with partitions inserted to a model in said each added layer, from a first layer to a last layer;
   for said each added layer, following steps are repeated, until an unsatisfiable result is obtained, or a satisfiable result on a concrete model is obtained:
      generating another formula, by abstracting a previous Boolean formula, eliminating or adding clauses, based on said book-keeping information, and running said satisfiability solver;
   if said satisfiability solver returns an unsatisfiable result, then unsatisfiable core in last Boolean formula is identified; and
   another unsatisfiable core is generated using said book-keeping information, wherein clauses in the last layer are only from said first Boolean formula, and are the same as said first Boolean formula from the first layer, using a backward mapping scheme produced by a simplification mechanism, in order to extract the original clauses that generated the simplified clauses, by iterating generation and abstraction procedures, to be used for another abstraction.

* * * * *